United States Patent [19]
DeBoer et al.

[11] Patent Number: 5,994,026
[45] Date of Patent: Nov. 30, 1999

[54] FLEXOGRAPHIC PRINTING PLATE WITH MASK LAYER AND METHODS OF IMAGING AND PRINTING

[75] Inventors: Charles D. DeBoer, Palmyra; Mitchell S. Burberry, Webster, both of N.Y.

[73] Assignee: Eastman Kodak Company, Rochester, N.Y.

[21] Appl. No.: 09/050,724

[22] Filed: Mar. 30, 1998

[51] Int. Cl.⁶ .................................................. G03C 1/72
[52] U.S. Cl. .................................. 430/270.1; 430/281.1; 430/306; 430/944
[58] Field of Search ................ 430/270.1, 944, 430/281.1, 306

[56] References Cited

U.S. PATENT DOCUMENTS

| | | |
|---|---|---|
| 3,060,024 | 10/1962 | Burg et al. . |
| 4,108,659 | 8/1978 | Dini . |
| 4,132,168 | 1/1979 | Peterson . |
| 4,238,561 | 12/1980 | Grossa et al. ............................ 430/253 |
| 4,323,637 | 4/1982 | Chen et al. . |
| 4,429,027 | 1/1984 | Chambers, Jr. et al. . |
| 4,555,471 | 11/1985 | Barzynski et al. ....................... 430/273 |
| 5,156,938 | 10/1992 | Foley et al. . |
| 5,171,650 | 12/1992 | Ellis et al. . |
| 5,262,275 | 11/1993 | Fan . |
| 5,354,633 | 10/1994 | Lewis et al. . |
| 5,506,086 | 4/1996 | Van Zoeren . |
| 5,576,141 | 11/1996 | Neumann et al. ....................... 430/269 |
| 5,576,142 | 11/1996 | Neumann et al. ....................... 430/269 |
| 5,705,310 | 1/1998 | Van Zoeren . |
| 5,719,009 | 2/1998 | Fan . |
| 5,759,742 | 6/1998 | West et al. ............................ 430/278.1 |

FOREIGN PATENT DOCUMENTS 0 679 531 A1   4/1994   European Pat. Off. .

*Primary Examiner*—Janet Baxter
*Assistant Examiner*—Barbara Gilmore
*Attorney, Agent, or Firm*—J. Lanny Tucker

[57] ABSTRACT

A flexographic imaging element comprises a support having thereon a relief imaging layer and a multi-level writeable mask layer. This mask layer is capable of multi-level communication with the underlying relief imaging layer so that the resulting image has continuous tone densities corresponding to the information written on the mask layer.

17 Claims, 1 Drawing Sheet

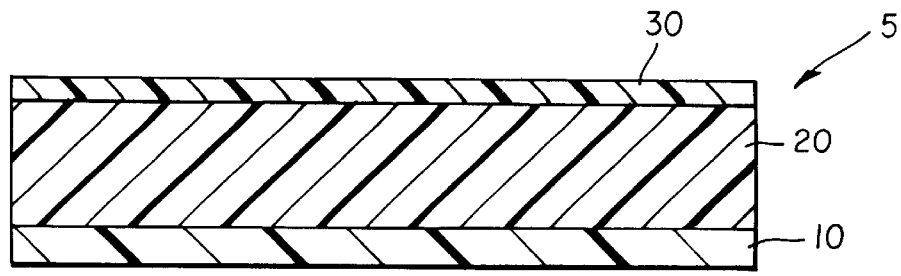
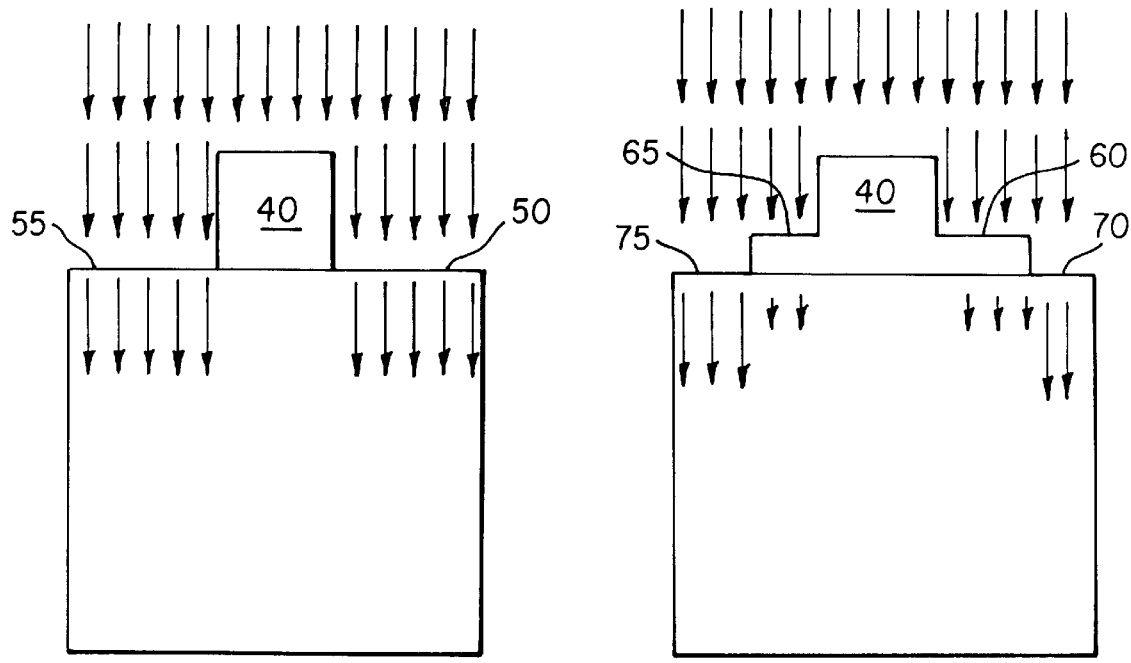
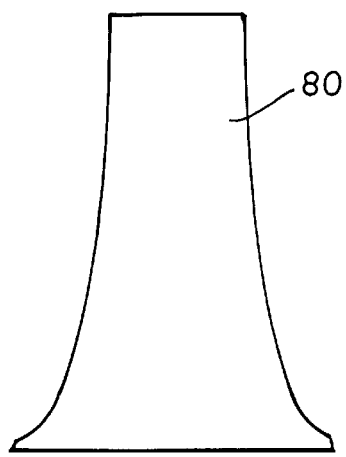 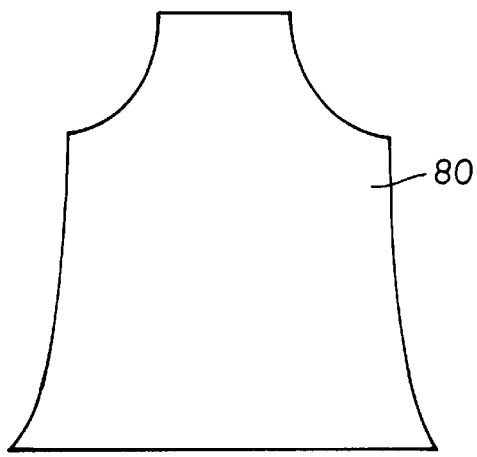

FLEXOGRAPHIC PRINTING PLATE WITH MASK LAYER AND METHODS OF IMAGING AND PRINTING

FIELD OF THE INVENTION

This invention relates to flexographic imaging elements that are writeable and have an integral mask that can be used to provide a continuous tone image without the use of ablation.

BACKGROUND OF THE INVENTION

Flexographic printing plates are well known for use in letterpress printing, particularly on surfaces that are soft and easily deformable, such as packaging materials, for example cardboard, wrapping paper and plastic films. Flexographic printing plates can be prepared using photopolymerizable compositions, such as those described in U.S. Pat. No. 4,323,637 (Chen et al) to form relief images. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, polymerization, and hence, insolubilization of the photopolymerizable layer occurs in the exposed areas. Treatment with a suitable solvent (such as a developer) removes the unexposed areas of the photopolymerizable layer, leaving a relief image that can be used for flexographic printing.

Imagewise exposure of a photosensitive element conventionally requires the use of a phototool which is a mask, having transparent and opaque areas covering the photopolymerizable layer. The mask prevents exposure and polymerization in the opaque areas. It allows exposure to radiation in the transparent areas so that the underlying layer polymerizes and remains on the support after the development step. The mask is usually a photographic negative of the desired printing image. If corrections are needed in the final image a new negative must be made. This is a time-consuming process. In addition, the mask may experience slight dimensional changes due to changes in temperature and humidity. Thus, the same mask, when used at different times or in different environments, may provide different results and could cause registration problems.

Thus, it would be desirable to avoid the use of such masks and to directly record information on a photosensitive element, for example by means of a laser beam. The image to be developed could then be translated into digital information and the digital information used to direct the laser for imaging. The digital information could even be transmitted from a distant location. Corrections could be made easily and quickly by adjusting the digitized image. In addition, the digitized image could be either positive or negative, eliminating the need to have both positive-working and negative-working photosensitive materials, or positive and negative masks. This would save storage space and, thus, reduce cost. Another advantage would be that registration can be precisely controlled by a machine during the imaging step. Digitized imaging without a mask would be particularly well-suited for making seamless, continuous printing forms.

In general, it has not been very practical to use lasers to directly image the elements that are used to prepare flexographic printing plates. Such elements have low photosensitivity and require long exposure times even with high powered lasers. In addition, most of the photopolymerizable materials used in these elements have their greatest sensitivity in the ultraviolet region of the electromagnetic spectrum. While UV lasers are known, economical and reliable UV lasers with high power are generally not available. However, non-UV lasers are available which are relatively inexpensive, and which have a useful power output and can be used to form a mask image on top of flexographic printing elements.

U.S. Pat. No. 5,262,275 (Fan) describes a photosensitive flexographic printing plates having a laser ablatable masking layer. This layer is capable of absorbing infrared radiation but is opaque to actinic radiation, coated over a barrier layer and photopolymerizable layer. During use, the masking layer is imagewise ablated using IR radiation, forming a mask image that blocks actinic radiation in the areas of the photopolymerizable layer where development is desired. The element is then overall exposed with actinic radiation to cure the exposed areas of the photopolymerizable layer, followed by processing in a suitable solvent (or developer) to remove the unexposed areas of the element Thus, a flexible relief image in a final flexographic printing plate is produced.

Ablation techniques have a disadvantage in that they produce solid debris that can be a hazard and requires wiping and collection to insure that it does not materially affect the desired image. U.S. Pat. No. 5,705,310 (Van Zoeren) describes an element similar to that described in the Fan patent, but it also has a cover sheet for collecting material ablated from the mask layer during the imaging step.

The elements and methods for their use described in these references also suffer from the disadvantage that ablation is a binary process, meaning that it produces only either opaque or essentially transparent areas upon imaging, and does not provide areas of intermediate density. In other words, a mask image formed using ablation tends not to have continuous tone images.

Besides ablation processes, laser imaging is known for a number of other well-known applications such as color proofing and dye transfer. As described in EP 0 679 531A1 (Savini et al), laser-induced transfer processes may be used in dye sublimation processes to transfer colorants to receiver elements. However, these processes are discouraged because of resulting inferior images that are mottled and have other image defects.

There is a need in the industry to have flexographic imaging elements that provide excellent continuous tone images and that can be prepared without the use of ablation.

SUMMARY OF THE INVENTION

The present invention overcomes the problems noted above with a flexographic imaging element comprising a support, and having thereon, in order from the support:

a) a relief imaging layer that is developable to provide a multi-level relief image, and b) integral to and in communication with the relief imaging layer, a multi-level writeable mask layer that is capable of providing multi-level information written thereon, to the relief imaging layer.

This invention also provides a method of imaging comprising the steps of:

A) providing the imaging element described above,

B) imaging the imaging element to provide a multi-level mask image in the mask layer, C) providing a multi-level image in the relief imaging layer corresponding to the multi-level mask image in the mask layer, and D) developing the relief imaging layer.

The imaging element of this invention has a topmost multi-level writeable mask layer that blocks out all actinic radiation (radiation in the UV, blue and green regions of the spectrum). One advantage of this invention is that the masking layer is in intimate contact with (or integral with) the undeveloped relief imaging layer, with no air gaps that can cause actinic radiation scattering and loss of resolution in the final printing plate. The mask layer is "writeable" meaning that imagewise information can be imparted to the layer using a suitable analog or digital imaging means (for example, an IR laser).

Another advantage is that the writeable mask layer requires no processing chemicals that can change its dimensions, causing misregistration on the printing press.

An important advantage of this invention is that the mask layer can be imaged in a "multi-level" manner, that is, it is imaged in gradations so that continuous tone masking can be achieved. Therefore, the mask layer is designed so that the multi-level information generated or written therein, can be communicated in a suitable continuous-tone fashion to the relief imaging layer. Thus, the pixels at the edge of a printing dot can be written to partial density, providing varying densities to shape the relief image of the final flexographic printing element following development.

DESCRIPTION OF THE FIGURES

FIG. 1 is a simplified cross-sectional view of an imaging element of the invention.

FIG. 2A is an exploded, cross-sectional view of an imaging element of the prior art having a mask layer that is written on by an ablation process described in the prior art.

FIG. 2B is an exploded, cross-sectional view of an imaging element having a mask layer that is written on by the method of this invention.

FIG. 3A is a profile view of a flexographic imaging element image dot obtained using an ablation process described in the prior art FIG. 3B is a profile view of a flexographic imaging element image dot obtained by the method of this invention.

DETAILED DESCRIPTION OF THE INVENTION

The imaging element of this invention can be described by reference to FIG. 1, which illustrates a preferred embodiment of this invention. In FIG. 1, imaging element 5 includes support 10, nonimaged and undeveloped relief imaging layer 20, and multi-level writeable mask layer 30.

The support for the element can be any flexible material that is conventionally used in photosensitive elements. Examples of such materials include, but are not limited to, polymeric films such as those formed from addition polymers or linear condensation polymers, transparent foams and fabrics. A preferred support material is a polyester film, such as a polyethylene terephthalate film. Flexible metal or paper sheets, or laminates of any of these and polymeric films, can also be used as the support.

The thickness of the support can be varied, as long as it is sufficient to sustain the wear of a printing press, but thin enough to be flexible for wrapping around the printing form. A preferred support material is a polyethylene terephthalate film having a thickness from about 100 to about 200 $\mu$m. The support should resist stretching so the color records will register in a full color image. The support may be coated with one or more "subbing" layers to improve adhesion of the final assemblage. The back side of the support may be coated with antistat agents and/or slipping layers or matte layers to improve handling and "feel" of the element.

The undeveloped relief imaging layer of the element, as is generally known in the art, generally comprises an elastomeric or rubbery binder material along with at least one curable or polymerizable material. In a preferred embodiment, the curable or polymerizable material is a photocurable or photopolymerizable material that is sensitive to radiation commonly in the ultraviolet, blue and green regions of the electromagnetic spectrum (that is from about 300 to about 500 nm). The terms "photocurable" and "photopolymerizable" are generally recognized as essentially the same in the art of flexographic printing plates.

As used herein, the term "photopolymerizable" is intended to encompass systems which are photopolymerizable, photocrosslinkable, or both. In one embodiment, the photopolymerizable material comprises at least one photopolymerizable monomer that can be polymerized upon exposure to the actinic radiation. The layer would also include one or more polymerization initiators that have a sensitivity to the actinic radiation noted above. In most cases, the initiator will be sensitive to any visible or ultraviolet radiation.

In other embodiments, the photocurable material includes one or more photocrosslinkable polymers. Such materials must also be "developable", meaning that uncrosslinked polymer must be removable in a developer as described herein. Other curing systems can also be used, including curing by epoxide polymerization as is well known in the adhesive arts.

Any known photopolymerizable compositions that are known in the art to be suitable for imaging layers in flexographic printing plates can be used in the present invention. Examples of suitable compositions have been disclosed, for example, in U.S. Pat. No. 4,323,637 (Chen et al), U.S. Pat. No. 4,427,749 (Gruetzmacher et al) and U.S. Pat. No. 4,894,315 (Feinberg et al).

The elastomeric binder materials used in the relief imaging layer can be one or more polymers that are soluble, swellable or dispersible in aqueous, semi-aqueous or organic solvent developers. Binder materials that are soluble or dispersible in aqueous or semi-aqueous developers have been disclosed in U.S. Pat. No. 3,458,311 (Alles), U.S. Pat. No. 4,442,302 (Pohl), U.S. Pat. No. 4,361,640 (Pine), U.S. Pat. No. 3,794,494 (Inoue et al), U.S. Pat. No. 4,177,074 (Proskow), U.S. Pat. No. 4,431,723 (Proskow), and U.S. Pat. No. 4,517,279 (Worn), all incorporated herein by reference. Binder materials that are soluble, swellable or dispersible in organic solvent developers include natural or synthetic polymers of conjugated diolefin hydrocarbons (such as polyisoprene, 1,2-polybutadiene, 1,4-polybutadiene, butadiene/acrylonitrile, butadiene/styrene thermoplastic-elastomeric block copolymers and other copolymers). Useful block copolymers are described in U.S. Pat. No. 4,323, 636 (Chen), U.S. Pat. No. 4,430,417 (Heinz et al), and U.S. Pat. No. 4,045,231 (Toda et al), incorporated herein by reference.

The binder material(s) is generally present in the relief imaging layer in an amount of at least 65%, and preferably from about 70 to about 80%, (dry weight) of the layer.

The term "binder material", as used herein, also includes core/shell microgels and blends of microgels and preformed macromolecular polymers, such as those disclosed in U.S. Pat. No. 4,956,252 (Fryd et al).

The relief imaging layer can contain a single monomer or a mixture of monomers that are compatible with the binder material to the extent that a clear, non-cloudy photopolymerizable layer is produced. Photopolymerizable monomers that can be used are well known in the art, including those described in U.S. Pat. No. 4,323,636 (noted above), U.S. Pat. No. 4,753,865 (Fryd et al), U.S. Pat. No. 4,726,877 (Fryd et al), and U.S. Pat. No. 4,894,315 (noted above), all incorporated herein by reference. The one or more monomers are present in the layer generally in an amount of at least 5%, and preferably from about 10 to about 20% of total layer dry weight.

When present, the photoinitiator can be any single compound or combination of compounds that is sensitive to the non-infrared actinic radiation described above, and which generates free radicals that initiate the polymerization of the monomer or monomers without excessive termination. The photoinitiator is generally sensitive to the actinic radiation described above, and preferably sensitive to ultraviolet radiation. It should be thermally inactive at and below 185° C. Examples of suitable photoinitiators include the substituted and unsubstituted polynuclear quinones. Examples of other suitable photoinitiators are disclosed for example, in U.S. Pat. No. 4,460,675 (Gruetzmacher) and U.S. Pat. No. 4,894,315 (noted above), both incorporated herein by reference. The photoinitiators are generally present in the relief imaging layer in an amount of from about 0.001% to about 10% based on the dry weight of the layer.

If the relief imaging layer is composed of one or more photocurable polymers instead of monomers, the photocurable polymer(s) can act both as binder material and photosensitive material. Alternatively, the photocurable polymer(s) can be mixed with one or more binder materials as described above, as long as the various layer components are compatible and developable in the non-imaged areas.

The relief imaging layer can contain other additives depending on the final properties desired. Such additives include sensitizers, rheology modifiers, thermal polymerization inhibitors, tackifiers, plasticizers, colorants, antioxidants, or fillers.

The thickness of the relief imaging layer can vary over a wide range depending upon the type of printing element desired. For so called "thin plates" the layer can be from about 0.05 to about 0.15 cm in thickness. Thicker elements will have a relief imaging layer up to 0.7 cm in thickness.

The imaging element of this invention does not have a barrier layer as described for the elements imaged by ablation described in U.S. Pat. No. 5,262,275 (noted above). Thus, the elements of this invention have only two essential layers on the support for imaging and the intended purpose of the element, and the multi-level level writeable mask layer is integral to or adjacent the relief imaging layer.

The multi-level writeable mask layer is designed to be "written" on (or imaged) with a focused energy source such as electromagnetic radiation, electron beam, or ultrasound. In principle, any source of energy that can be focused can be used. In practice, visible or infrared light is easy to focus to a small spot and is a stable source that is easy to modulate. In a preferred embodiment of the invention, infrared radiation is used, such as from an infrared radiation-emitting diode laser of the kind available from Spectra Diode Laboratories (San Jose, Calf.). Diode pumped YAG lasers are also an effective energy source.

Thus, the mask layer must be sensitive to whatever radiation source is to be used. This is accomplished by including within the mask layer, various components that provide the desired sensitivity. For example, when infrared radiation is used to image the mask layer, the layer is capable of absorbing infrared radiation which imagewise converts the heat into a suitable multi-level image.

Thus, if a infrared radiation emitting laser beam is used, the layer must be able to convert that radiation into heat. This can be accomplished by including within the mask layer, one or more infrared photothermal conversion materials. Such materials are well known in the art as having a strong absorption in the infrared region of the electromagnetic spectrum (typically from 750 to 20,000 nm). Particularly useful infrared photothermal conversion materials are infrared radiation absorbing dyes, such as poly(substituted) phthalocyanine compounds, cyanine dyes, squarylium dyes, chalcogenopyryloarylidene dyes, bis(chalcogenopyrylo) polymethine dyes, oxyindolizine dyes, bis(aminoaryl) polymethine dyes, merocyanine dyes, croconium dyes, metal thiolate dyes, and quinoid dyes. See for example, U.S. Pat. No. 5,019,549 (Kellogg et al), U.S. Pat. No. 5,674,661 (Neumann), U.S. Pat. No. 4,948,776 (Evans et al), U.S. Pat. No. 5,491,045 (DeBoer et al), and U.S. Pat. No. 4,942,141 (DeBoer et al), all incorporated herein by reference.

Opaque inorganic pigments, such as carbon black, graphite, copper chromite, chromium oxides, cobalt chrome aluminate, metals such as aluminum, copper or zinc, and alloys of bismuth, indium and copper, cannot be used as infrared photothermal conversion materials in the practice of this invention. They are useful in prior art elements where laser ablation is used to image the mask layer. In the present invention, ablation is not used for imaging for reasons described above. Other imaging means (described below) are used, and the noted opaque inorganic pigments cannot be used with those imaging means.

The amount of useful infrared photothermal conversion materials in the mask layer would be readily apparent to one skilled in the art for the intended purpose. In general, the amount if from about 0.1 to about 40% based on the total dry weight of the mask layer.

The infrared photothermal conversion material(s) are generally provided in admixture with one or more binder materials to provide physical strength and integrity in the mask layer. Suitable binder materials include cellulosic polymers (such as cellulose acetate, cellulose acetate butyrate, cellulose acetate propionate, and nitrocellulose), vinyl polymers (such as polyvinylacetate, polyvinylbutyral, polystyrene, polyacrylic acids, polyvinyl alcohol, polyolefins, and polymethacrylates and polyacrylates). In general, any film forming thermoplastic resin may be used as a binder material for this layer. In a preferred embodiment, the binder material is a cellulosic polymer such as nitrocellulose. The binder material should also be soluble or dissolvable in the developer that is used after imaging.

The mask layer further comprises one or more components that, upon thermal (for example, IR) exposure of the layer, provides multi-level imaging of that layer. For example, such a component can be a chemical moiety (such as an acid), that is can inhibit or initiate polymerization of the curable or polymerizable material(s) in the relief imaging layer. Such a chemical component is imagewise diffusable from the mask image layer to the relief imaging layer in response to the imaging energy applied to the mask layer. In this manner, the information imaged in the mask layer can be "communicated" to the relief imaging layer in an imagewise fashion to provide a continuous tone printing image after development Preferably, however, such communication of information is accomplished by means of actinic radiation (UV, blue and green radiation). In such an embodiment, the mask layer contains one or more sublimable dyes that absorb essentially the actinic radiation, and sublime or evaporate from the layer in proportion to the applied thermal imaging energy, thereby providing varying image densities in the mask layer based on the imaging intensity of the heat. The amount of dye(s) remaining in the mask layer will determine the amount of subsequent photocuring that will occur in the relief imaging layer. In this way, "multi-level communication" of the image is accomplished between the two layers.

Dye sublimation is quite different from ablation. In dye sublimation, an imageable component (for example, a sublimable dye) is converted into gaseous form and dissipated into the atmosphere. In ablation, the material is converted into both gaseous and solid debris that is blown off the element in an explosive fashion In some instances, the solid debris is adhered to the element and must be wiped off or otherwise removed. The preferred embodiment of this invention utilizes dye sublimation, not ablation.

While a single, "broad band" sublimable dye may be used in this fashion, typically a mixture of dyes is used so radiation over the entire range of the electromagnetic spectrum is absorbed. Sublimable dyes that can be used in this fashion are described, for example, in U.S. Pat. No. 5,576,141 (Neumann et al), U.S. Pat. No. 5,576,142 (Neumann et al), U.S. Pat. No. 5,521,050 (Neumann et al), U.S. Pat. No. 5,521,051 (Neumann et al), U.S. Pat. No. 5,510,228 (Neumann et al), all incorporated herein by reference. A preferred dye or mixture of dyes includes curcumin and thioxanthone.

The sublimable dye(s) are present in the mask layer sufficient to provide the multi-level masking of photopolymerizable of the relief imaging layer that is desired. A skilled worker in the art would be able to determine the useful and optimal amounts for specific dyes with routine experimentation. Generally, such dyes are present in an amount of at least 25%, based on total layer dry weight While the preferred embodiment of the invention has been illustrated by the use of a sublimable mask layer and communication between the layers by actinic radiation, it will be clear to those skilled in the art that other methods and means of communication of the image may also be used, as noted above with respect to diffusible chemical components.

The properties of the multi-level mask layer can be modified by using other ingredients, such as, plasticizers, dispersants, surfactants, and coating aids, provided that they do not adversely affect the imaging properties of the element. Examples of such optional addenda are described in U.S. Pat. No. 5,262,275 (noted above).

The imaging element of this invention can be prepared by first preparing the relief imaging layer formulation and applying it in a suitable fashion to the support. The multi-level mask layer is then similarly applied. Conventional coating techniques and conditions can be used for both layers, but hot melt calendaring or extrusion, lamination, and vapor deposition techniques can also be used. Commonly known coating methods include spin coating, knife coating, gravure coating, dip coating, or extrusion hopper coating. Solvents, coating and drying conditions are chosen based on the nature of the materials used in the layers, as is well known to those skilled in the art of flexographic printing plate manufacture.

The method of operation of the invention is illustrated as follows with reference to the preferred embodiment:

The imaging element of the invention is exposed to high intensity focused laser energy from a conventional source (such as diode laser emitting at from 750 to 880 nm), that is absorbed by the infrared sublimable, multi-level writeable mask layer, thus heating the layer and causing part or all of the sublimable dyes in the layer to sublime or evaporate from the layer in an imagewise fashion. A vacuum cleaning dust collector may be useful during the laser exposure step to keep the focusing lens clean. Such a collector is fully described in U.S. Pat. No. 5,574,493 (Sanger et al). After the laser exposure, the mask image in the mask layer then masks some areas of the layer to ultraviolet, blue and green radiation while other areas are transparent to such radiation.

The next step in the process is to overall (floodwise) expose the imaging element to actinic radiation through the mask layer. The type of radiation used in this step is dependent upon the type of photocurable material and/or photoinitiator in the relief imaging layer. The mask image over the relief imaging layer prevents it from being exposed to the radiation. Curing or photopolymerization occurs in proportion to the density of the overlying mask layer.

Any conventional source of actinic radiation can be used for this exposure step. Examples of suitable visible or UV sources include carbon arcs, mercury-vapor arcs, fluorescent lamps, electron flash units, electron beam units and photographic flood lamps. The most suitable sources of UV radiation are mercury-vapor lamps, particularly sun lamps. A standard radiation source is the Sylvania 350 Blacklight fluorescent lamp (FR 48T12/350 VL/VHO/180, 115 w) which has a central wavelength of emission around 354 nm.

The actinic radiation exposure time can vary from a few seconds to several minutes, depending upon the intensity and spectral energy distribution of the radiation, its distance from the imaging element, and the nature and thickness of the photopolymerizable relief imaging layer. Typically, a mercury vapor arc or a sunlamp is used at a distance of about 3.8 to 153 cm from the imaging element. Exposure temperatures are preferably from about 20 to about 35° C.

The process of the invention optionally includes a back exposure or backflash step. This is a blanket exposure to actinic radiation through the support. It is used to create a shallow layer of polymerized material, or a "floor", on the support side of the photopolymerizable relief imaging layer and to sensitize that layer. The "floor" provides improved adhesion between the relief imaging layer and the support, helps highlight dot resolution and also establishes the depth of the plate relief. The backflash exposure can take place before, after or during the other imaging steps. It is preferred that it take place just prior to the thermal imagewise exposure of the multi-level mask layer. Any of the conventional radiation sources described above can be used for the backflash exposure step. Exposure time will vary from a few seconds to a minute.

FIG. 2A is a schematic view of a mask image obtained using the prior art ablation methods (notably U.S. Pat. No. 5,262,275) during the overall (floodwise) actinic exposure of the imaging element. The unremoved area 40 of the mask layer blocks actinic radiation (identified by arrows), but all the actinic radiation passes through the removed areas 50 and 55. The actinic radiation penetrates deeply into the imaging element in these exposed areas. The shape or profile of the resulting dot 80 (after development) in the relief imaging layer is shown in FIG. 3A. This profile, being long and thin, results from the binary ("on or off") masking function of the mask image shown in FIG. 2A Unfortunately, dots having this type of profile are weak and flexible, prone to break off, and overly sensitive to flexible movement in the printing process.

In contrast, FIG. 2B shows an imaged masking layer achieved by the present invention. Completely unremoved area 40 in the mask layer stops all actinic radiation from reaching the relief imaging layer below. However, partially removed areas 60 and 65 allow some actinic radiation (that is the radiation is attenuated) to pass through, but not all of it, partially curing the relief imaging layer below. Fully removed areas 70 and 75 allow full transmission of actinic radiation into the relief imaging layer below. The resulting dot 80 in the relief imaging layer is schematically shown in FIG. 3B. The dot is stronger, and is less prone to breakage from movement during printing. The height of the dot shoulders achieved by the present invention can be varied by varying the density of the partially exposed areas of the mask layer. This can be done by varying the thermal imaging conditions and energy.

Following overall (floodwise) exposure to radiation through the mask image formed in the mask layer, the desired image in the relief imaging layer is developed by contacting the element with a suitable developer. Development is usually carried out at about room temperature. The developers can be organic solvents, or aqueous or semi-aqueous solutions. The choice of the developer will depend upon the chemical nature of the photopolymerizable or photocurable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published DE 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary, but it is preferably in the range of from about 2 to about 25 minutes. Developer can be applied in any convenient manner, including immersion, spraying and brush or roller application. Brushing aids can be used to remove the unpolymerized portions of the relief imaging layer. However, washout is frequently carried out in an automatic processing unit that uses developer and mechanical brushing action to removed the unexposed portions of the element, leaving a relief image constituting the exposed portions of the relief imaging layer and any "floor" formed from backflash exposure through the support.

A pre-development step may be necessary if the mask layer material is not readily removable by the developer. An additional developer, which does not effect the polymerized material, can be applied to remove the mask layer material first.

Following solvent development, the elements are generally blotted or wiped dry, and then dried in a forced air or infrared oven. Drying times and temperatures may vary, however, typically the plate is dried for 60 to 120 minutes at 60° C. Higher temperatures are not recommended because the support can shrink, causing registration problems.

The flexographic imaging elements can be uniformly post-exposed to ensure that the photocuring process is complete and that the element will remain stable during printing and storage. This post-exposure step can be carried out using the same actinic radiation source used in the primary exposure step.

Detackification is another optional post-development treatment that can be carried out if the surface is still tacky, and such tackiness is not removed during a post-exposure step. Tackiness can be eliminated by methods well known in the art, such as treatment with bromine or chlorine solutions. Such treatments have been disclosed in, for example, U.S. Pat. No. 4,400,459 (Gruetzmacher), U.S. Pat. No. 4,400,460 (Fickes et al) and DE 28 23 300. Detackification can also be accomplished by exposure to radiation sources having a wavelength not longer than 300 nm, as disclosed in EP-A-0 017 927 and U.S.Pat. No. 4,806,506 (Gibson).

Unless otherwise indicated, the term "flexographic printing plate or imaging element" encompasses plates or elements in any form suitable for flexographic printing, including but not limited to, flat sheets and seamless continuous forms.

The elements of this invention can be used in the formation of seamless, continuous imaging elements. The flat sheet elements can be reprocessed by wrapping the element around a cylindrical form, usually a printing sleeve or the printing cylinder itself, and fusing the edges together to form a seamless, continuous element. In a preferred method, the relief imaging layer is wrapped around the cylindrical form and the edges joined as known in the art This wrapped layer can then be spray coated with an appropriate formulation to form the multi-level writeable mask layer.

Continuous imaging elements have applications in the flexographic printing of continuous designs such as in wallpaper, decoration and gift wrapping paper. Furthermore, such continuous imaging elements are well-suited for mounting on conventional laser equipment. The sleeve or cylinder on which the imaging element is wrapped when the edges are fused, can be mounted directly into the laser apparatus where it functions as the rotating drum during the laser exposure step.

The lasers used to expose the mask layer of this invention are preferably diode lasers, because of the reliability and low maintenance of diode laser systems, but other lasers such as gas or solid state lasers may also be used.

The invention has been described in detail, with particular reference to certain preferred embodiments thereof, but it should be understood that variations and modifications can be effected with the spirit and scope of the invention.

We claim:

1. A flexographic imaging element comprising a support, and having thereon, in order from said support:
   a) a relief imaging layer that is developable to provide a multi-level relief image, said relief imaging layer being sensitive to actinic radiation having a wavelength of from about 300 to about 500 nm, and
   b) integral to and in communication with said relief imaging layer, a multi-level writeable mask layer that is capable of providing multi-level information written thereon, to said relief imaging layer, said multi-level writeable mask layer comprising one or more sublimable dyes that absorb substantially all of said actinic radiation.

2. The imaging element of claim 1 wherein said multi-level writeable mask layer further includes an infrared photothermal conversion material.

3. The imaging element of claim 2 wherein said multi-level writeable mask layer further comprises a binder material, and said infrared photothermal conversion material is an infrared radiation absorbing dye.

4. The imaging element of claim 3 wherein said binder material is a thermoplastic polymer.

5. The imaging element of claim 4, wherein said binder material is cellulosic polymer.

6. The imaging element of claim 5 wherein said binder material is cellulose acetate, cellulose acetate butyrate, cellulose acetate propionate or nitrocellulose.

7. The imaging element of claim 1 wherein said relief imaging layer comprises a photocurable polymer.

8. The imaging element of claim 1 wherein said relief imaging layer comprises a photopolymerizable monomer and a photoinitiator.

9. The imaging element of claim 1 wherein said support is a polymer film, metal or paper sheet, or a laminate of two or more of these materials.

10. The imaging element of claim 1 wherein said sublimable dyes are present in said multi-level writeable mask layer an amount of at least 25% based on total layer dry weight.

11. The imaging element of claim 1 wherein said relief imaging layer comprises a curable or polymerizable material, and said multi-level writeable mask layer comprises a chemically active material that inhibits or initiates curing or polymerization of said curable or polymerizable material.

12. A method of imaging comprising the steps of:

A) providing the imaging element of claim 1,

B) imaging said imaging element to provide a multi-level mask image in said mask layer, C) providing a multi-level image in said relief imaging layer corresponding to said multi-level mask image in said mask layer, and D) developing said relief imaging layer.

13. The method of claim 12 wherein said imaging element comprises an infrared photothermal conversion material in said multi-level mask layer, and step B is accomplished by imagewise heating.

14. The method of claim 13 wherein said multi-level mask layer further comprises one or more sublimable dyes that absorb substantially all actinic radiation having a wavelength of from about 300 to about 500 nm, and said relief imaging layer is sensitive to said actinic radiation.

15. The method of claim 13 wherein said imagewise heating is accomplished using an infrared radiation emitting laser.

16. The method of claim 12 wherein step C is provided by overall exposure of said imaging element to actinic radiation.

17. The method of claim 12 wherein step D is carried out by contacting said imaging element with a developing solution to remove non-imaged areas of said relief imaging layer.

* * * * *